United States Patent
Ishikawa et al.

(10) Patent No.: US 6,730,644 B1
(45) Date of Patent: May 4, 2004

(54) CLEANING SOLUTION FOR SUBSTRATES OF ELECTRONIC MATERIALS

(75) Inventors: Norio Ishikawa, Saitama-ken (JP); Yumiko Abe, Saitama-ken (JP); Kiyoto Mori, Saitama-ken (JP)

(73) Assignee: Kanto Kagaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/550,152

(22) Filed: Apr. 17, 2000

(30) Foreign Application Priority Data

Apr. 20, 1999 (JP) .......................... 11-111569

(51) Int. Cl.$^7$ .............. C11D 1/02; C11D 7/08
(52) U.S. Cl. ........... 510/175; 510/176; 510/177; 134/1.3; 252/79.1; 252/79.3; 438/692; 438/693
(58) Field of Search .............. 134/1.3, 2, 2.6, 134/6; 252/79.1, 79.3; 438/692, 693; 510/175, 176, 177

(56) References Cited

U.S. PATENT DOCUMENTS

| | | | |
|---|---|---|---|
| 3,963,635 A | * | 6/1976 | Dawson et al. |
| 4,002,579 A | * | 1/1977 | Mizutani et al. |
| 4,032,466 A | * | 6/1977 | Otrhalek et al. |
| 4,806,259 A | * | 2/1989 | Amjad |
| 4,959,105 A | * | 9/1990 | Neidiffer et al. |
| 5,221,359 A | * | 6/1993 | Kaupert |
| 5,318,677 A | * | 6/1994 | Hirbour et al. |
| 5,397,397 A | * | 3/1995 | Awad |
| 5,462,697 A | * | 10/1995 | Yianakopoulos |
| 5,695,572 A | | 12/1997 | Brunner et al. ............ 134/3 |
| 5,705,089 A | * | 1/1998 | Sugihara et al. |
| 5,855,811 A | * | 1/1999 | Grieger et al. |
| 5,972,862 A | * | 10/1999 | Torii |
| 5,981,454 A | * | 11/1999 | Small |
| 6,044,851 A | * | 4/2000 | Grieger et al. |
| 6,090,214 A | * | 7/2000 | Zhou et al. |

FOREIGN PATENT DOCUMENTS

| | | | | |
|---|---|---|---|---|
| DE | 42 09 865 A1 | | 9/1993 | ........... H01L/21/30 |
| EP | 0 678 571 A2 | | 10/1995 | ........... C11D/3/30 |
| EP | 0 812 011 A2 | | 10/1997 | ......... H01L/21/306 |
| EP | 0 812 011 A2 | | 12/1997 | ......... H01L/21/306 |
| FR | 2 722 511 | | 7/1995 | ........... C23G/1/14 |
| GB | 1059668 | * | 5/1964 | |
| JP | 71039059 B | * | 3/1967 | |
| JP | 72051691 | * | 2/1973 | |
| JP | 48073408 A | * | 10/1973 | |
| JP | 49015643 | * | 2/1974 | |
| JP | 04026800 | * | 5/1990 | |
| JP | 02156530 | | 6/1990 | ......... H01L/21/304 |
| JP | 10-72594 | | 3/1998 | |
| SU | 549359 A | * | 7/1977 | |
| WO | WO 98/36045 A | | 8/1998 | ............ C11D/3/18 |
| WO | WO 99/15609 | | 4/1999 | ............ C11D/1/168 |

OTHER PUBLICATIONS

Advanced Cleaning Product Formulations, vol. 2, 1994, Mill Road, NJ, Noyes Publication.*
Semiconductor World, 92, 3 (1997) with an abridged English translation.

* cited by examiner

Primary Examiner—Gregory Webb
(74) Attorney, Agent, or Firm—Darby & Darby

(57) ABSTRACT

The present invention relates to a cleaning solution capable of removing efficiently at the same time particles and metallic impurities from a substrate surface without corroding metallic materials.

The cleaning solution for cleaning substrates of electronic materials comprises an organic acid compound and at least one selected from the group consisting of dispersants and surfactants.

12 Claims, No Drawings

CLEANING SOLUTION FOR SUBSTRATES OF ELECTRONIC MATERIALS

BACKGROUND OF THE INVENTION

The invention relates to a cleaning solution for substrates of electronic materials, and particularly to a cleaning solution for removing metallic impurities and particle contamination adsorbed by substrates having metallic wiring in semiconductor manufacturing.

A trend for higher integration of ICs has brought about the need for strict contamination control, because trace impurities have a considerable effect on the properties and yield of devices. Which means that the concentration of metallic impurities and the presence of particles on the substrate need to be strictly controlled; for this purpose different types of cleaning solutions are used in the different processes of semiconductor manufacturing.

In general, mixed solutions of sulfuric acid-aqueous hydrogen peroxide, ammonium water-aqueous hydrogen peroxide-water (SC-1), hydrochloric acid-aqueous hydrogen peroxide-water (SC-2), diluted hydrofluoric acid, etc. are used as cleaning solutions for cleaning substrates of electronic materials such as semiconductor substrates, and depending on the purpose, each cleaning solution can be used on its own or in combination with other cleaning solutions.

Further, in recent years chemical mechanical polishing (CMP) technology has been introduced into semiconductor manufacturing processes for the planarization of insulation films, the planarization of contact holes, for damascene wiring, etc. CMP is a technology for polishing and planarizing insulation films and metallic materials by simultaneously using the chemical and physical effects, when a wafer is pressed against a polishing cloth called buff and is rotated while feeding a slurry, a mixture of abrasive particles and chemicals.

The slurry used in metal CMP (W and Cu—CMP) is a combination of abrasive particles (alumina, silica, manganese dioxide, cerium oxide, zirconium oxide, etc.) and an oxidizer (iron(III) nitrate, aqueous hydrogen peroxide, etc.). Therefore, after the CMP process, the substrate surface is contaminated by metallic impurities and abrasive particles from the slurry, as well as by polishing waste. Especially when iron(III) nitrate is used as oxidizer, there is the fear that due to the contamination by a high Fe concentration, a secondary contamination, polluting the production line, occurs in addition to the deterioration of the electrical properties of the substrate itself.

Consequently, the metallic impurities and the particles adhering during the CMP process need to be speedily removed before passing to the next process.

In the CMP treatment of interlayer insulation films, dilute hydrofluoric acid is used for removing metallic impurities and ammonia water is used for removing particles.

However, since dilute hydrofluoric acid corrodes metallic materials it cannot be used for cleaning after Cu and W—CMP.

An aqueous solution of citric acid is reported in Semiconductor World, p. 92, No. 3, 1997 as a cleaning solution not corroding metallic materials. Moreover, JP, A, H10-72594 proposes a method for improving the capacity for removing metallic impurities by combining citric acid and other organic acids with a complexing solution. However, these cleaning solutions of organic acids are insufficient for removing metallic impurities and incapable of removing particles.

Ammonia water used for removing particles also corrodes copper, hence it is not suitable as cleaning solution after Cu—CMP. Moreover, the use of 2 types of cleaning solution for the cleaning process complicates the production processes and considerably increases the amount of chemicals used. Consequently, a new cleaning technology capable of removing particles and metallic impurities without corroding metallic materials is also needed from the cost point of view and for the protection of the environment.

Thus, when cleaning substrates of electronic materials, a cleaning solution for performing a simple and efficient cleaning without going through a troublesome process is strongly required.

I.e., the object of the present invention is to provide a cleaning solution for substrates of electronic materials capable of removing at the same time metallic impurities and particles from the substrate surface without corroding metallic materials.

In the present invention, the term substrate for electronic materials embraces semiconductor wafers, color filters, substrates of electronic devices for thin-film applications (flat panel devices such as liquid crystals, plasma, EL, etc., optic and magnetic discs, CCD, etc.), etc.

SUMMARY OF THE INVENTION

As a result of extensive research to achieve the above-mentioned object, the inventors of the present invention have completed the invention by finding that, surprisingly, adsorbed metallic impurities and particles can both be cleaned very efficiently at the same time without the corrosion of metal by adding dispersants and/or surfactants to an aqueous solution of organic acids such as oxalic acid, etc.

I.e., the present invention relates to a cleaning solution for cleaning substrates of electronic materials comprising one or more organic acid compounds and at least one selected from the group consisting of dispersants and surfactants.

The invention further relates to the before-mentioned cleaning solution, wherein the organic acid compound is one or more member(s) selected from the group consisting of oxalic acid, malonic acid, succinic acid, malic acid, tartaric acid, citric acid and their ammonium salts.

The invention further relates to the before-mentioned cleaning solution, wherein the surfactant is an anionic or a nonionic surfactant.

The invention further relates to the before-mentioned cleaning solution, wherein the dispersant is one or more member(s) selected from a group consisting of condensed phosphoric acids and phosphates.

The invention further relates to the before-mentioned cleaning solution, wherein the organic acid compound is 0.01 to 30 mass percentages.

The invention further relates to the before-mentioned cleaning solution, wherein the dispersant and the surfactant are 0.0001 to 10 mass percentages.

The invention further relates to the before-mentioned cleaning solution, wherein a chelating agent is further comprised.

The invention further relates to the before-mentioned cleaning solution, wherein a water-soluble alcohol is further comprised.

The invention further relates to the before-mentioned cleaning solution, wherein the metallic impurities and the particle contamination adsorbed by a substrate are both removed at the same time.

The invention further relates to the before-mentioned cleaning solution, wherein the substrate of electronic materials is a substrate to which metallic wiring has been applied.

The invention further relates to the before-mentioned cleaning solution used after chemical mechanical polishing.

The cleaning mechanism of the cleaning solution according to the present invention is not necessarily clear; however, the following reason can be presumed. Ordinarily, the particles in an aqueous solution have an electric charge called zeta potential, which also applies to semiconductor substrates. If the electric charge of the substrate and the particles are of the opposite sign, the particles are adsorbed by the substrate due to the attractive force between substrate and particles. But if they are of the same sign, the particles are not adsorbed by the substrate due to the repulsive force. I.e., it is thought that by controlling the zeta potential, the adsorption of particles can be prevented and adsorbed particles can be removed. One of the important factors for controlling the zeta potential is the pH value. On the alkaline side at a pH of 8 or more, when most substances have a negative electric charge, the adsorption of particles is suppressed and their desorption is made easy. It is thought that for such reasons alkalies such as ammonia are traditionally used for removing particles.

It is further thought that zeta potentials can also be controlled by adding surfactants and a dispersant. The method using a dispersant and surfactants according to the present invention does not change liquidity very much and is therefore preferable as a method for solving the problem.

PREFERRED EMBODIMENTS OF THE INVENTION

The organic acid compound used in the present invention is selected from aliphatic monocarboxylic acids such as formic acid, acetic acid, propionic acid, etc.; dicarboxylic acids such as oxalic acid, malonic acid, succinic acid, etc.; hydroxylated polycarboxylic acids such as tartaric acid, malic acid, citric acid, etc.; and their ammonium salts. Among these, polycarboxylic acids are preferably used as organic acid compounds in the present invention because they are highly effective for removing metallic impurities.

The concentration of the organic acid compound in the cleaning solution is 0.01 to 30 mass percentages, and particularly preferable is 0.03 to 10 mass percentages. If the concentration of the organic acid compound is too low, the cleaning performance is insufficient; if however an overly high concentration is used, it is impossible to achieve an effect matching the concentration. Moreover, the concentration is also determined in consideration of the solubility of the organic acid and so as to avoid crystallization.

Moreover, any dispersant and surfactant may be used as long as the desired object of the present invention can be achieved. As dispersant condensed phosphoric acids such as metaphosphoric acid, pyrophosphoric acid, etc., and phosphates such as phytic acid, di(polyoxyethylene)alkylether phosphoric acid, tri(polyoxyethylene)alkylether phosphoric acid, etc. are typically used; e.g., di(polyoxyethylene) alkylether phosphoric acid is commercially available under the trade names of NIKKOL DDP-8, NIKKOL DDP-10, etc. and tri(polyoxyethylene)alkylether phosphoric acid is commercially available under the trade names of NIKKOL TDP-8, NIKKOL TDP-10, (all of Nikko Chemicals Co., Ltd.) etc. Further, as surfactant anionic or nonionic surfactants are typically used; anionic surfactants with a sulfonic group or a carboxyl group which are highly hydrophilic and nonionic surfactants whose hydrophilic properties can be increased by the length of the ethylene oxide chain are particularly effective; specifically, polyethylene nonylphenylether and sorbitan type. nonionic surfactants, e.g. commercially available under the trade names of Emulgen MS-110, Rheodol Super TW-0120 (of KAO Soap Co., Ltd.), sulfonic acid or sulfonate type anionic surfactants, e.g. commercially available under the trade names of Newcol 210, Newcol 560SF, Newcol 707SF (of Nippon Nyukazai Co., Ltd.) and further anionic high molecular surfactants can be mentioned. As anionic high molecular surfactants, e.g., 1) naphthalene sulfonic acid and formaldehyde condensates and their salts, 2) polymers with carboxylic acids such as acrylic acid, methacrylic acid, etc. and their salts and 3) lignosulfonic acid and its salts can be given as examples. 1) is commercially available under the trade names of Demol N, Demol AS (of KAO Soap Co., Ltd.), Polystar NP-100 (of Nihon Yushi Company), Runox 1000, 1000C, 1500A (of Toho Chemical Industry Co., Ltd.), Ionet D-2, Sanyo Levelon PHL (of Sanyo Chemical Industries, Ltd.), Loma PWA-40 (of Sannopku Co., Ltd.), etc.; Demol AS and Loma PWA-40 which are ammonium salts or free acids not containing metallic impurities are particularly preferable. 2) is commercially available under the trade names of Demol EP, POIZ 520, POIZ 521, POIZ 532A (of KAO Soap Co., Ltd.), Polystar A-1060, Polystar OM, Polystar OMA (of Nihon Yushi Company), Polity 530, Polity 540, Polity 550 (of Lion Corporation), Carrybon B, Carrybon L-400, Eleminol MBN-1, Sanspal PS-2, Sanspal PS-8, Sanspal PDN-173, Sanspal PS-30, Toxanon GR-31A, Toxanon GR-30, Toxanon NSA-400 (of Sanyo Chemical Industries Ltd.), Disrol H14N (of Nippon Nyukazai Co., Ltd.), etc.; POIZ 532A and Polystar OMA which are ammonium salts or free acids are particularly preferable. 3) is commercially available under the trade name of Sorpol 9047K (of Toho Chemical Industry Co., Ltd.). Na and other metals can be used when changed to H or $NH_4$ by treating natrium salt or other metal salts with ion exchange resins etc.

The concentration of the dispersant and the surfactant is 0.0001 to 10 mass percentages, preferable 0.001 to 1.0 mass percentages, and most preferably 0.001 to 0.1 mass percentages. If the concentration of the dispersant is low, the removing performance is insufficient; if however it is too high, it is impossible to achieve an effect matching the concentration.

Moreover, water-soluble alcohols can be added to increase the affinity of the cleaning solution according to the present invention with the substrate and to suppress the foaming of the surfactant.

As water-soluble alcohols methanol, ethanol, 1-propanol, 2-propanol, 2-methyl-1-propanol, 2-methoxyethanol, etc. can be used. The concentration of the water-soluble alcohols is 0.01 to 30 mass percentages, particularly preferable is 1 to 10 mass percentages.

A chelating agent can also be added to further improve the ability for removing metallic impurities of the cleaning solution according to the present invention.

As chelating agent polyaminocarboxylic acids and their ammonium salts are preferred, specifically ethylene diamine tetraacetic acid, nitrilotriacetic acid, trans-1,2-cyclohexanediamine tetraacetic acid and their ammonium salts can be mentioned. The concentration of the chelating agent is 0.0001 to 0.1 mass percentages, particularly preferable is 0.0001 to 0.01 mass percentages.

EXAMPLES

The Examples and Comparative Examples given below are to explain the present invention in detail and not to limit it.

The cleaning solutions according to the present invention and the cleaning solution used for comparison were prepared according to Table 1.

TABLE 1

| Cleaning solution | Organic acid compound (mass percentages) | Dispersant, surfactant, chelating agent, water soluble alcohol (mass percentages) | |
|---|---|---|---|
| Example 1 | Oxalic acid 0.34 | Disrol H14N | 0.01 |
| Example 2 | Oxalic acid 0.34 | Polity 550 | 0.01 |
| Example 3 | Oxalic acid 0.34 | Sorpol 9047K | 0.01 |
| Example 4 | Oxalic acid 0.34 | Newcol 707SF | 0.01 |
| Example 5 | Oxalic acid 0.34 | Rheodol Super TW-0120 | 0.01 |
| Example 6 | Oxalic acid 0.34 | Pyrophosphoric acid | 0.01 |
| Example 7 | Oxalic acid 0.34 | Demol AS | 0.01 |
| Example 8 | Oxalic acid 0.03 | Demol AS | 0.001 |
| Example 9 | Oxalic acid 3.40 | Demol AS | 0.1 |
| Example 10 | Oxalic acid 0.34 | Phytic acid | 0.01 |
| Example 11 | Oxalic acid 0.34 | NIKKOL TDP-8 | 0.01 |
| Example 12 | Oxalic acid 0.34 | Newcol 560SF | 0.01 |
| | | Phytic acid | 0.01 |
| | | 2-propanol | 1.0 |
| Example 13 | Malonic acid 0.5 | Demol AS | 0.1 |
| Example 14 | Citric acid 10.0 | Demol AS | 1.0 |
| Example 15 | Ammonium oxalate 0.2 | Newcol 707SF | 0.01 |
| Example 16 | Oxalic acid 0.34 | Ethylene diamine tetraacetic acid diammonium salt | 0.01 |
| | | Newcol 560SF | 1.0 |
| Example 17 | Triammonium citrate 1.0 | Phytic acid | 1.0 |
| | | Nitrilotriacetic acid | 0.01 |
| Example 18 | Oxalic acid 2.0 | Newcol 560SF | 0.01 |
| | | Phytic acid | 0.01 |
| | | 2-propanol | 10.0 |
| Comp. Ex. 1 | Oxalic acid 0.34 | — | |
| Comp. Ex. 2 | Citric acid 0.50 | — | |
| Comp. Ex. 3 | — | Demol AS | 0.01 |
| Comp. Ex. 4 | Oxalic acid 0.34 | tetradecyl trimethyl-ammonium chloride | 0.01 |

Note:
Disrol H14N, Newcol 560SF and Newcol 707SF are products of Nippon Nyukazai Co., Ltd.
Polity 550 is a product of Lion Corp.
Sorpol 9047K is a product of Toho Chemical Industry Co., Ltd.
Rheodol Super TW-0120 and Demol AS are products of KAO Soap Co., Ltd.
NIKKOL TDP-8 is a product of Nikko Chemicals Co., Ltd.

The following Experiments were conducted with the prepared cleaning solution. (0019)

Experiment 1 (Particle Removing Performance 1: Alumina Particles)

Soaked in a CMP slurry (WA-355: Fe-20=1:1 mixed solution, oxidizer: iron(III) nitrate, abrasive particles: alumina) manufactured by Cabot Corp., 4-inch φ silicon wafers (about 10000 particles of 0.24 μm or more) with an oxide film were contaminated beforehand by particles, cleaned for 3 min. at 25° C. with the cleaning solutions of Examples 1 to 18 and Comparative Examples 1 to 4, rinsed and dried, after which the number of particles was measured with a wafer surface inspection device Surfscan 4500 (manufactured by KLA-Tencor Corp.). The number of particles before and after the cleaning process was compared, and the capacity for removing particles of the respective cleaning solutions was evaluated. The result is shown in Table 2.

TABLE 2

| Cleaning solution | Particle (alumina) removing ratio (%) |
|---|---|
| Example 1 | 98.8 |
| Example 2 | 97.1 |
| Example 3 | 95.0 |
| Example 4 | 94.6 |
| Example 5 | 97.8 |
| Example 6 | 99.2 |
| Example 7 | 90.1 |
| Example 8 | 93.7 |
| Example 9 | 99.6 |
| Example 10 | 98.7 |
| Example 11 | 94.3 |
| Example 12 | 99.1 |
| Example 13 | 95.6 |
| Example 14 | 96.5 |
| Example 15 | 92.2 |
| Example 16 | 97.8 |
| Example 17 | 98.2 |
| Example 18 | 99.3 |
| Comp. Example 1 | 42.0 |
| Comp. Example 2 | 60.4 |
| Comp. Example 3 | 46.7 |
| Comp. Example 4 | 12.7 |

Experiment 2 (Particle Removing Performance 2: Silica)

Soaked in an aqueous solution in which silica particles (with a diameter of 0.3 μm) were dispersed, 4-inch φ silicon wafers (about 13000 particles of 0.24 μm or more) with an oxide film were contaminated beforehand by particles, cleaned for 3 min. at 25° C. with the cleaning solutions of Examples 4, 5, 12–16, 18 and Comparative Example 1, rinsed and dried, after which the number of particles was measured with a wafer surface inspection device Surfscan 4500 (manufactured by KLA-Tencor Corp.). The number of particles before and after the cleaning process was compared, and the capacity for removing particles of the respective cleaning solutions was evaluated. The result is shown in Table 3.

TABLE 3

| Cleaning solution | Particle (silica) removing ratio (%) |
|---|---|
| Example 4 | 91.9 |
| Example 5 | 89.5 |
| Example 12 | 98.1 |
| Example 13 | 97.5 |
| Example 14 | 98.3 |
| Example 15 | 95.3 |
| Example 16 | 97.9 |
| Example 18 | 96.2 |
| Comp. Example 1 | 54.2 |

Experiment 3 (Fe Removing Performance)

4-inch φ silicon wafers with an oxide film were contaminated beforehand with Fe by soaking them in a 0.1 mass percentage aqueous solution of iron (III) nitrate, after which the Fe concentration at the wafer surface was measured by using a total reflection fluorescence X-ray device (TREX-610T manufactured by Technos Co., Ltd.).

The wafers were cleaned for 3 min. at 25° C. with the cleaning solutions of Examples 1 to 6 and Comparative Examples 1 and 2, rinsed and dried, after which the Fe concentration at the wafer surface was again measured, and the capacity for removing Fe was evaluated. The result is shown in Table 4.

TABLE 4

| Cleaning solution | Fe concentration (× $10^{10}$ atoms/cm$^2$) |
|---|---|
| Before cleaning | about 7600 |
| Example 1 | 2.6 |
| Example 2 | 3.0 |
| Example 3 | 2.4 |
| Example 4 | 2.8 |
| Example 5 | 3.8 |
| Example 6 | 2.7 |
| Comp. Example 1 | 4.7 |
| Comp. Example 2 | 321 |

It is clear from the above that the cleaning solutions according to the present invention show excellent performances for removing particles and metallic impurities.

What is claimed is:

1. A cleaning solution for cleaning substrates of electronic materials consisting essentially of:
   (a) one or more organic acid compounds; and
   (b) at least one surfactant selected from the group consisting of anionic surfactants having a carboxyl group, naphthalenesulfonic acid and salts thereof, formaldehyde condensates and salts thereof, polymers with carboxylic acids, and lignosulfonic acid and salts thereof.

2. The cleaning solution according to claim 1, wherein the organic acid compound is one or more members selected from the group consisting of oxalic acid, malonic acid, succinic acid, malic acid, tararic acid, citric acid, and amonium salts thereof.

3. The cleaning solution according to claim 1, wherein the organic acid compound is 0.01 to 30 mass percentages.

4. The cleaning solution according to claim 1, wherein the concentration of the surfactant ranges from 0.0001 to 10% by weight, based upon 100% weight of total cleaning solution.

5. The cleaning solution according to claim 1, wherein the metallic impurities and the particle contamination adsorbed by a substrate are both removed at the same time.

6. The cleaning solution according to claim 1, wherein the substrate of electronic materials is a substrate to which metallic wiring has been applied.

7. The cleaning solution according to claim 6, used after chemical mechanical polishing.

8. The cleaning solution according to claim 2, wherein the metallic impurities and the particle contamination adsorbed by a substrate are both removed at the same time.

9. The cleaning solution according to claim 3, wherein the metallic impurities and the particle contamination adsorbed by a substrate are both removed at the same time.

10. The cleaning solution according to claim 4, wherein the metallic impurities and the particle contamination adsorbed by a substrate are both removed at the same time.

11. The cleaning solution according to claim 2, wherein the substrate of electronic materials is a substrate to which metallic wiring has been applied.

12. A cleaning solution for cleaning substrates of electronic materials consisting essentially of:
   (a) one or more organic acid compounds; and
   (b) from 0.001 to 1% by weight of an anionic surfactant having a sulfonic group.

* * * * *